United States Patent [19]

Suzuki

[11] Patent Number: 5,054,077
[45] Date of Patent: Oct. 1, 1991

[54] FADER DEVICE

[75] Inventor: Takashi Suzuki, Hamamatsu, Japan

[73] Assignee: Yamaha Corporation, Hamamatsu, Japan

[21] Appl. No.: 556,337

[22] Filed: Jul. 20, 1990

[30] Foreign Application Priority Data

Jul. 26, 1989 [JP] Japan .................................. 1-193411

[51] Int. Cl.⁵ ............................................. H03G 3/00
[52] U.S. Cl. .................................... 381/109; 381/107; 381/119
[58] Field of Search ................. 381/119, 109, 98, 107; 84/625, 660, 615, 653, 622

[56] References Cited

U.S. PATENT DOCUMENTS

| 3,784,748 | 1/1974 | Brinkerhoff | 381/109 |
| 3,859,618 | 1/1975 | Nishioka et al. | 381/109 |
| 4,402,246 | 9/1983 | Sekiguchi | 84/622 |

FOREIGN PATENT DOCUMENTS 0140508 6/1987 Japan .................................. 381/104

Primary Examiner—Jin F. Ng
Assistant Examiner—Sylvia Chen
Attorney, Agent, or Firm—Spensley Horn Jubas & Lubitz

[57] ABSTRACT

A fader device used for an audio mixer etc. includes fader operators capable of being operated both manually and by a motor individually for each of plural channels, a signal processing circuit for applying a signal processing to an input signal of each channel in accordance with an amount of operation of a corresponding one of the fader operators, a fader operation mode switching circuit for switching a fader operation between a single operation mode and a group operation mode, and a control circuit for performing a fader control. In the single operation mode, each of the fader operators can be individually operated. In the group operation mode, operation of any one of a group of the fader operators causes other fader operators of the group to be compulsorily operated or to be driven automatically to positions corresponding to absolute amounts of fading in respective channels in accordance with an amount of operation of the one fader operator. Owing to such operation manner, the absolute amounts of fading in the respective channels can be readily recognized.

6 Claims, 3 Drawing Sheets

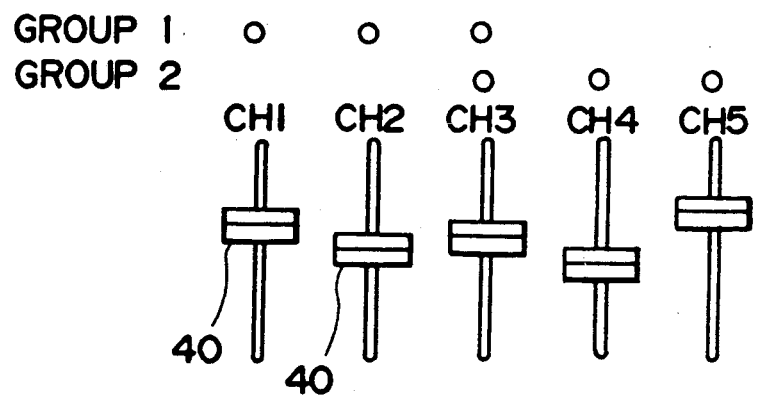
F I G. 4.
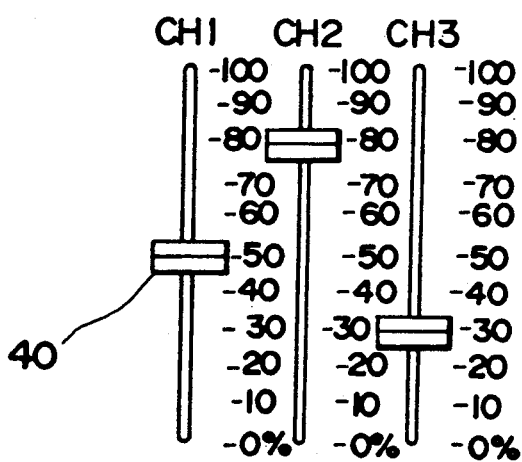
F I G. 5

FADER DEVICE

BACKGROUND OF THE INVENTION

This invention relates to a fader used in an audio mixer, a dimmer or the like and, more particularly, to a fader device in which absolute amounts of fading in respective channels can be readily recognized when fader operators of respective channels are operated as a group.

A fader is a device for changing gain continuously and is used for, e.g., an audio device such as an audio mixer for individual adjustment of signal levels of multiple channels in mixing these signals. A fader has a fader operator for each input channel and adjusts a signal level or the like individually for each channel by operation of the fader operators.

In the course of adjusting signals levels of the respective channels individually in a fader device, there sometimes occurs an excessive increase or decrease in the signal level as a whole while the relative relation of the signal level among the respective channels is maintained in a good relation and, in this case, adjustment of the signal level as a whole becomes necessary. In this case, it is extremely troublesome and difficult to achieve the desired adjustment by operating the fader operators individually while maintaining the relative relation of the signal level among the respective channels unchanged.

For overcoming this difficulty, there is a prior art fader device in which, as shown in FIG. 2, a group master fader 20 is provided aside from faders 11 to 16 for respective channels CH1 to CH6 for adjusting the amount of fading as a whole. FIG. 3 shows a circuit construction of this fader device. Input signals of the respective channels CH1, CH2, CH3 . . . are adjusted in level by the individual faders 11, 12, 13, . . . and delivered out through VCAs (voltage-controlled type amplifiers) 21, 22, 23, . . . . There is also provided an operation mode changing switch 30 for switching the fader operation manually between a single operation mode and a group operation mode. When the switch 30 is switched to the single operation mode, the VCAs 21, 22, 23, . . . all become fixed at a reference gain 0 dB and amounts of fading of the respective channels are adjusted only by operation of the individual faders 11, 12, 13, . . . . When the switch 30 is switched to the group operation mode, the VCAs 21, 22, 23, . . . are controlled commonly by the group master fader 20 to adjust the amount of fading as a whole.

According to the level adjustment by the group master fader 20 of the prior art fader device, the operation of the group master fader 20 causes amounts of fading of the respective channels CH1, CH2, CH3 . . . to be changed while fader operators 10 of the respective channels remain unmoved. Accordingly, relation between positions of the respective fader operators 10 and actually obtained amounts of fading of the respective channels is not determined so that absolute amounts of fading in the respective channels cannot be readily recognized by observing the positions of the fader operators 10. This is particularly so in a case where a plurality of groups have been provided and the amount of fading by the group master fader 20 differs from group to group.

It is, therefore, an object of the invention to provide a fader device in which absolute amounts of fading in the respective channels in the group operation mode can be readily recognized.

SUMMARY OF THE INVENTION

A fader device achieving the above described object of the invention comprises fader operators capable of being operated both manually and by a motor individually for each of plural channels, signal processing means for applying a signal processing to an input signal of each channel in accordance with an amount of operation of a corresponding fader operator, fader operation mode switching means for switching a fader operation between a single operation mode and a group operation mode, and control means for performing a fader control in such a manner that, in the single operation mode, each of the fader operators can be individually operated and, in the group operation mode, operation of any one of a group of the fader operators causes other fader operators of the group to be compulsorily operated in accordance with an amount of operation of said one fader operator.

According to the invention, in the group operation mode, operation of any one of a group of the fader operators causes other fader operators of the group to be compulsorily operated in accordance with an amount of operation of the one fader operator so that the respective fader operators are positioned at positions corresponding to absolute amounts of fading in the respective channels and the absolute amounts in the respective channels thereby can be readily recognized.

In the prior art fader device shown in FIG. 2, if, in the course of adjusting fader operators 10 of the respective channels, one of the fader operators 10 has reached its full stroke and it is desired to further increase the level of this particular channel only, this can no longer be realized by operation of the group master fader 20 but an operation must be made in such a manner that all of the fader operators 10 are displaced backwardly while maintaining the relative positional relation among them and thereafter the fader operator 10 of the desired channel only is displaced forwardly. In contrast, according to the invention, once the operation mode is switched to the group operation mode in such a case and one of the fader operators in the group is operated to displace all of the fader operators backwardly and then the operation mode is restored to the single operation mode and a desired fader operator is operated whereby operation of the fader operators is greatly facilitated.

Preferred embodiments of the invention will be described below with reference to the accompanying drawings.

BRIEF DESCRIPTION OF THE DRAWINGS

In the accompanying drawings,

FIG. 4 is a diagram showing an example of grouping of fader operators according to the invention; and FIG. 5 is a diagram showing an example of operation state of the fader operators according to the invention.

DESCRIPTION OF PREFERRED EMBODIMENTS

Figure 1:
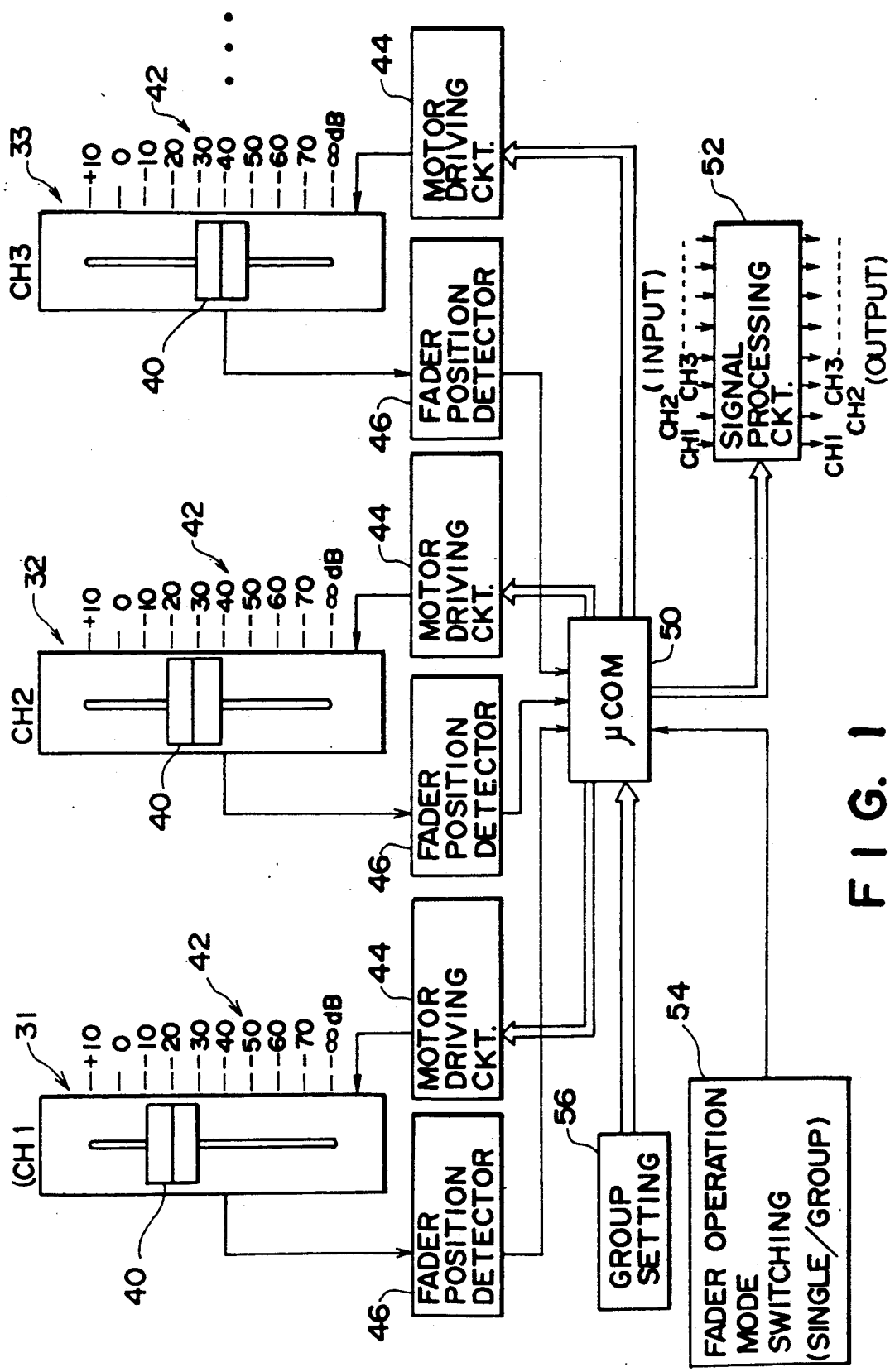
FIG. 1 is a block diagram showing an embodiment of the invention.
Figure 2:
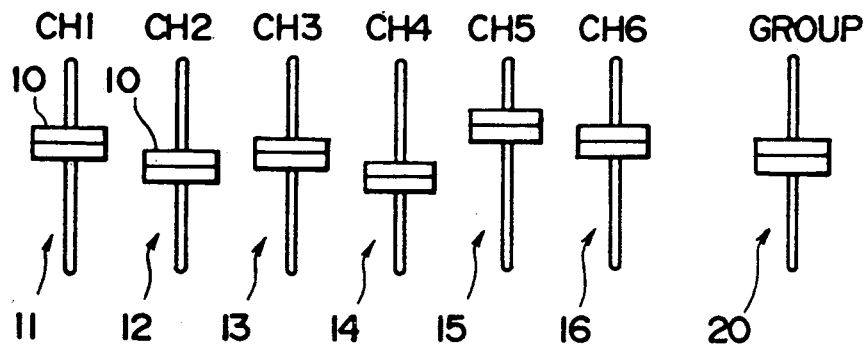
FIG. 2 is a diagram showing an example of disposition of fader operators in the prior art fader device having a grouping function.
Figure 3:
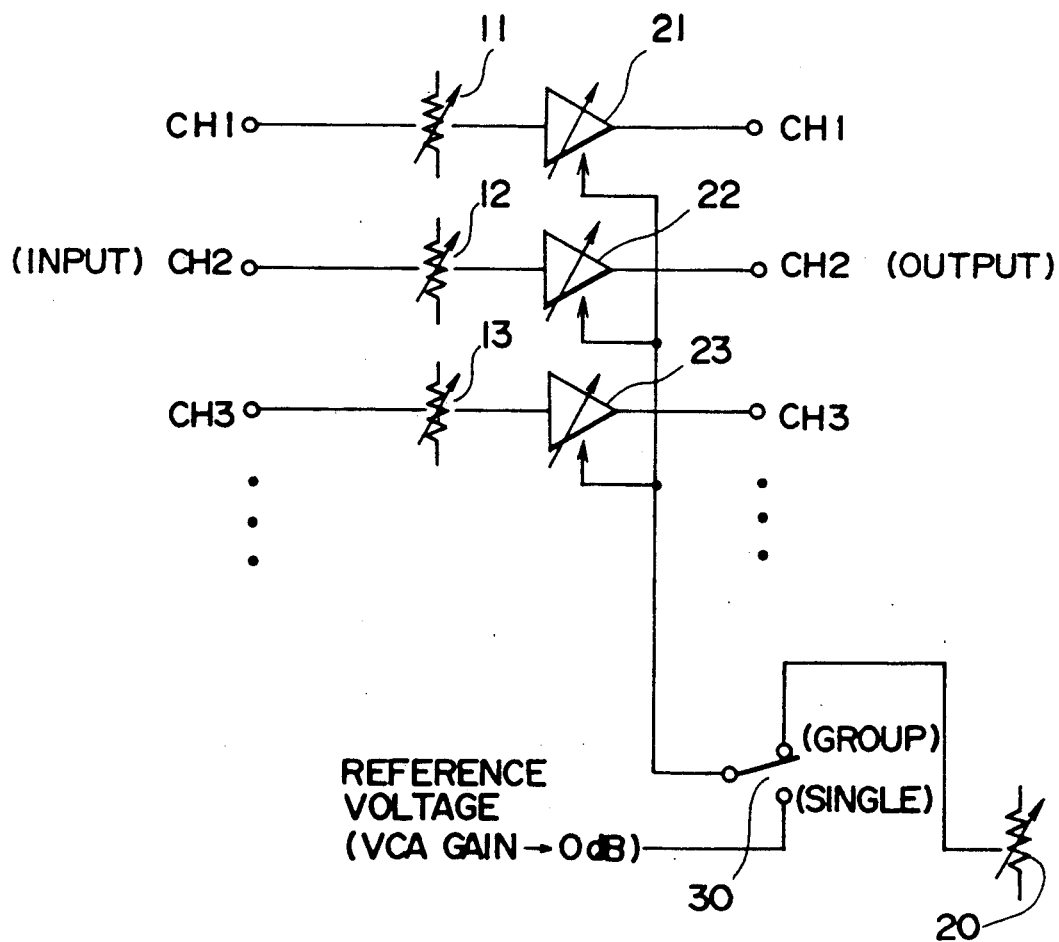
FIG. 3 is a circuit diagram showing an example of circuit construction of the prior art fader device.

A preferred embodiment of the invention is shown in FIG. 1. Faders 31, 32, 33, ... are provided in correspondence to respective channels CH1, CH2, CH3, ... and fader operators 40 are mounted slidably in forward and backward directions. On panels disposed on a side of the respective fader operators 40 are provided scales 42 indicating positions of the fader operators 40. In the present embodiment, the scales 42 are indicated in gain. The fader operators 40 can be operated both manually and by driving of a motor by actuating motor driving circuits 44.

Positions of the fader operators 40 of the respective channels are detected by fader operator position detectors 46. A microcomputer 50 produces control signals to a signal processing circuit 52 in response to fader operation position detection signals of the respective channels applied from the fader position detectors 46. Responsive to the control signals from the microcomputer 50, the signal processing circuit 52 applies a signal processing such as adjusting of a signal level to input signals of the respective channels in accordance with amounts of fading corresponding to the operation positions of the respective fader operators 40. In the case of signal processing of an analog system (e.g., using a VCA), the control signals from the microcomputer 50 are applied to the signal processing circuit 52 after being converted to analog signals through a digital-to-analog converter. In the case of signal processing of a digital system, the control of the signal processing circuit 52 is made by supplying a command for renewing a coefficient from the microcomputer 50 to digital signal processing LSI or the like device.

A fader operation mode switching circuit 54 is provided for switching the fader operation between a single operation mode and a group operation mode. A group setting circuit 56 is provided for determining the range of each group consisting of plural fader operators and also setting plural groups.

FIG. 4 shows an example of setting of groups. In the example of FIG. 4, the fader operators 40 of the channels, CH1, CH2 and CH3 constitute group 1 and the fader operators 40 of the channels CH3, CH4 and CH5 constitute group 2. In this case, the operation of the fader operators 40 in the group operation mode is shown in Table 1.

TABLE 1

| Manually operated channels | Following channels |
| --- | --- |
| CH1 | CH2, CH3 |
| CH2 | CH1, CH3 |
| CH3 | CH1, CH2, CH4, CH5 |
| CH4 | CH3, CH5 |
| CH5 | CH3, CH4 |

The operation of the fader device of FIG. 1 will now be described.

In the state where the fader operation mode switching circuit 54 is set in the single operation mode, amounts of fading in the respective channels are controlled individually by manual operation of the respective fader operators 40. More specifically, if the fader operator 40 of a particular channel is manually operated, the position of the fader operator 40 is detected by the fader position detector 46 and a position detection signal is applied to the microcomputer 50 which thereupon supplies a control signal to the signal processing circuit 52 and the amount of fading in the particular channel is controlled by the signal processing circuit. At this time, amounts of fading in the other channels remain unchanged.

When the fader operation mode switching circuit 54 has been switched to the group operation mode and one fader operator 40 in a group set by the group setting circuit 56 has been operated, the position of the fader operator 40 is detected by the fader position detector 46 and a position detection signal is applied to the microcomputer 50. The microcomputer 50 computes the amount of change in the fader operation from a difference between the current position and a position of the fader operator immediately before switching of the operation mode to the group operation mode. The microcomputer 50 then drives the motor driving circuits 44 to compulsorily displace the fader operators 40 of the other channels in the same group by servo control so that the same amount of change in the fader operation will be obtained in the other channels of the same group. A similar result is obtained when any of the other fader operators 40 of the same group is manually operated.

In this manner, by manually operating one of the fader operators 40 in a group, the other fader operators 40 in the same group are compulsorily displaced following the manually displaced fader operator 40 whereby the amounts of fading in the other channels of the same group are controlled by the signal processing circuit 52. An example of the above described operation starting from the state shown in FIG. 5 is as follows (in FIG. 5, the scale is indicated in percent):

(i) When the fader operator 40 of the channel CH1 is manually displaced to 70%, the fader operator 40 of the channel CH2 is compulsorily driven to 100% and the fader operator 40 of the channel CH3 to 50% respectively in an interlocking motion with the displacement of the fader operator 40 of the channel CH1.

(ii) When the fader operator 40 of the channel CH1 is manually displaced to 80%, the fader operator 40 of the channel CH3 is driven to 60% in an interlocking motion but the fader operator 40 of the channel CH2 which has reached its full upper stroke of 100% does not move beyond 100% (actual amount of fading stops at 100% also).

(iii) When the fader operator 40 of the channel CH1 is displaced to 100%, the fader operator 40 of the channel CH3 is driven to 80% in an interlocking motion but the fader operator 40 of the channel CH2 remains at 100%.

(iv) When the fader operator 40 of the channel CH2 is displaced to 90%, the fader operator 40 of the channel CH1 is driven to 60% and the fader operator 40 of the channel CH3 to 40% respectively in an interlocking motion.

(v) When the fader operator 40 of the channel CH2 is displaced to 30%, the fader operators 40 of the channels CH1 and CH3 are driven respectively to 0% in an interlocking motion. Even if the fader operator 40 of the channel CH2 is displaced downwardly, the fader operators 40 of the channels CH1 and CH3 do not move below 0% because these fader operators 40 have already reached their full lower stroke.

(vi) When the fader operator 40 of the channel CH3 is displaced to 10%, the fader operator 40 of the the channel CH1 is driven to 30% and the fader operator 40 of the channel CH2 to 60% in an interlocking motion.

In the foregoing manner, operation of one fader operator 40 in one group causes the other fader operators 40 in the same group to be compulsorily driven following the displacement of the one fader operator 40 whereby actually obtained amounts of fading in the respective channels are controlled to values corresponding to the positions of the respective fader operators 40. Accordingly, the respective fader operators 40 are always in positions corresponding to the absolute amounts of fading so that a player of the fader device can readily recognize the absolute amounts of fading in the respective channels by reading the scales 42. The same is the case with multiple grouping as shown in FIG. 4.

The control of the signal processing circuit 52 in the channels of the compulsorily driven fader operators 40 is made not only by detecting the fader operator positions after the compulsory displacement and controlling the amounts of fading in the signal processing circuit 52 on the basis of the detected amount of displacement but also by outputting by the microcomputer 50 of a fade amount control signal to control the amount of fading in the signal processing circuit 52 independently from driving control for the fader operators 40.

In a case where a fader operator 40 has been manually operated in a state where one or more of compulsorily driven fader operators have reached their full stroke positions, an arrangement may be made so that, when the player has released the manually operated fader operator, the entire fader operators will automatically return to positions at which said one or more compulsorily driven fader operators are at their full stroke. By this arrangement, the relative positional relation among the fader operators can be maintained.

In the above described embodiment, the fader operators are displaced in an interlocking motion while the relative positional relation with respect to one another is maintained. Alternatively, the fader operators may be displaced in an interlocking motion while a ratio of amounts of fading is maintained. If, for example, the ratio of the channel CH1 is reduced from 50% to 40% in the state shown in FIg. 5, the reduction is (50%−40%)/50%=20% and, therefore, the fader operators of the channels CH2 and CH3 may be displaced in an interlocking motion so that the channel CH2 will become 80%×0.8=64% and the channel CH3 will become 30%×0.8=24%.

In a case where the amount of displacement of the fader operator 40 does not change linearly with the actually obtained amount of fading, the fader operators may be driven so that the actually obtained amount of fading will change while a constant ratio of the amount of fading is maintained among the channels.

What is claimed is:
1. A fader device comprising:
   fader individually operators capable of being operated both manually and by electrical means a plurality of channels;
   signal processing means for applying signal processing to an input signal of each channel in accordance with an amount of operation of a corresponding one of the fader operators;
   fader operation mode switching means for switching a fader opertaion between a single operation mode and a group operation mode; and
   control means for performing a fader control in such a manner that, in the single operation mode, each of the fader operators can be indiviudally operated and, in the group operation mode, operation of any one of a group of the fader operators causes the other fader operators of the group to be automatically operated by said electrical means in accordance with an amount of operation of said one fader operator.

2. A fader device as defined in claim 1 further comprising group setting means for determining groups each consisting of a plurality of the fader operators.

3. A fader device as defined in claim 1 wherein said signal processing means comprises fader position detection means for detecting positions of the fader operators and producing position detection signals and means for supplying control signals in response to the position detection signals so as to apply signal processing to the input signals in accordance with amounts of fading corresponding to operation positions of the fader operators.

4. A fader device as defined in claim 1 wherein said signal processing means comprises means for producing a fade amount control signal to control amounts of fading in signal processing applied to the input signals independently from the automatic operation by said electrical means of the fader operators following operation of one of the fader operators in the group operation mode.

5. A fader device as defined in claim 1 wherein, in the group operation mode, the fader operators of the respective channels of the same group are automatically operated by said electric means while a relative positional relation of fader operators of the same group is maintained.

6. A fader device as defined in claim 1 wherein, in the group operation mode, the fader operators of respective channels of the same group are compulsorily operated by said electrical means while a ratio of amounts of fading of each fader operator is maintained.

* * * * *